(12) United States Patent
Tomimori et al.

(10) Patent No.: US 7,560,372 B2
(45) Date of Patent: Jul. 14, 2009

(54) PROCESS FOR MAKING A SEMICONDUCTOR DEVICE HAVING A ROUGHENED SURFACE

(75) Inventors: Hiroaki Tomimori, Kanagawa (JP); Hidemitsu Aoki, Kanagawa (JP); Kaoru Mikagi, Kanagawa (JP); Akira Furuya, Kanagawa (JP); Tetsuya Tao, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 63 days.

(21) Appl. No.: 11/525,943

(22) Filed: Sep. 25, 2006

(65) Prior Publication Data
US 2007/0015351 A1 Jan. 18, 2007

Related U.S. Application Data

(62) Division of application No. 10/318,199, filed on Dec. 13, 2002, now Pat. No. 7,170,172.

(30) Foreign Application Priority Data

Dec. 13, 2001 (JP) .............................. 2001-379923

(51) Int. Cl.
*H01L 23/485* (2006.01)
*H01L 23/488* (2006.01)

(52) U.S. Cl. ................. 438/612; 438/677; 257/E23.02; 257/E23.03

(58) Field of Classification Search ......... 438/612–657, 438/674–677; 257/E23.01–E23.03
See application file for complete search history.

(56) References Cited

U.S. PATENT DOCUMENTS

| 5,487,999 | A | 1/1996 | Farnworth |
| 5,545,589 | A | 8/1996 | Tomura et al. |
| 5,693,565 | A | 12/1997 | Camilletti et al. |
| 5,723,822 | A | 3/1998 | Lien |
| 6,005,290 | A | 12/1999 | Akram et al. |
| 6,242,813 | B1 | 6/2001 | Huang et al. |
| 6,358,847 | B1 * | 3/2002 | Li et al. ...................... 438/687 |
| 6,406,991 | B2 * | 6/2002 | Sugihara ..................... 438/613 |
| 6,560,862 | B1 | 5/2003 | Chen et al. |
| 6,700,198 | B2 | 3/2004 | Toya et al. |
| 6,798,050 | B1 * | 9/2004 | Homma et al. .............. 257/678 |

FOREIGN PATENT DOCUMENTS

| JP | 01-189153 | 7/1989 |
| JP | 01 283841 | 11/1989 |
| JP | 03-246945 | 5/1991 |
| JP | 8-064633 | 3/1996 |
| JP | 8-139433 | 5/1996 |
| JP | 9-115971 | 5/1997 |

(Continued)

*Primary Examiner*—Marcos D. Pizarro
(74) *Attorney, Agent, or Firm*—Young & Thompson

(57) ABSTRACT

An oxide film formed on the surface of copper film of an electrode pad is cleaned by oxalic acid after unevenness is formed on the surface of copper film by treating the surface with organic acid. Thereby, stable resistance is obtained when carrying out a characteristic inspection by bringing a probe into contact with the electrode pad, and it is easily recognized by observation through a microscope that the probe is brought into contact with the electrode pad. In addition, wettability with respect to solder is satisfactory, and it is possible to favorably form a solder bump on the electrode pad.

9 Claims, 7 Drawing Sheets

FOREIGN PATENT DOCUMENTS

| | | |
|---|---|---|
| JP | 10-189671 | 7/1998 |
| JP | 2001-174514 | 6/2001 |
| JP | 2001174514 A * | 6/2001 |
| JP | 2001-203205 | 7/2001 |
| JP | 2001-267356 | 9/2001 |
| WO | WO 00/59029 | 10/2000 |

* cited by examiner

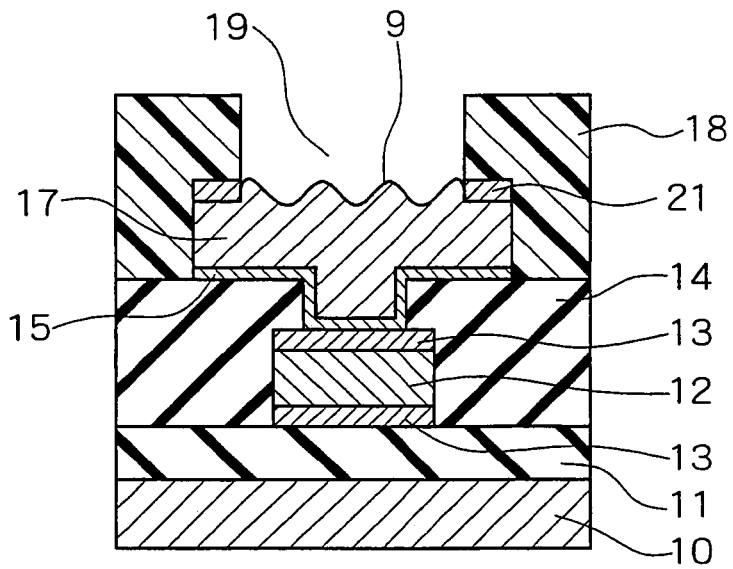
F I G. 2A
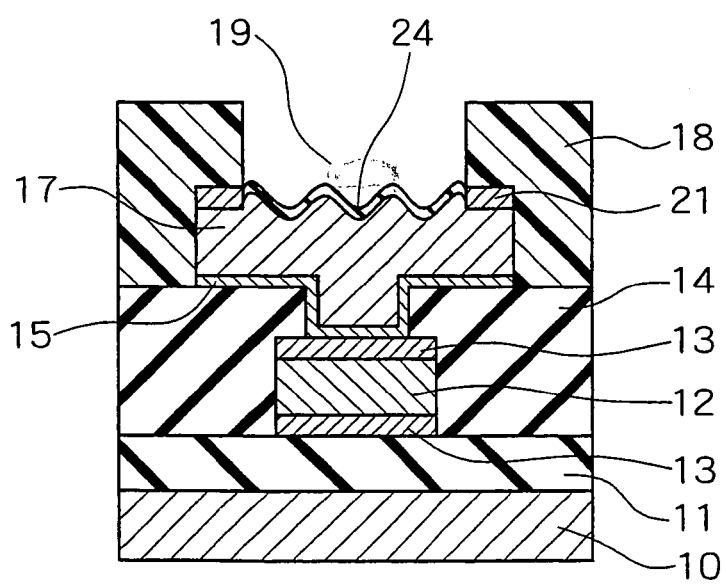
F I G. 2B

PROCESS FOR MAKING A SEMICONDUCTOR DEVICE HAVING A ROUGHENED SURFACE

BACKGROUND OF THE INVENTION

1. Technical Field of the Invention

The present invention relates to a semiconductor device having an electrode pad for inspection and a method for producing the same.

2. Description of the Related Art

When inspecting electrical characteristics of a semiconductor device formed on a semiconductor wafer, such a method has been generally employed, by which an inspection is carried out in such a state where an electrode pad for inspection is formed on a device to be inspected, and an inspection probe is brought into contact with the electrode pad. Hereinafter, a description is given of an example (hereinafter called Prior Art 1) for producing a semiconductor device on which an electrode pad for inspection is formed.

FIG. 1A through FIG. 1F are sectional views showing a prior art method for producing a semiconductor device in order of steps. As shown in FIG. 1A, a multilayer film 11 in which a wiring layer and an interlayer insulating film, etc., are laminated, is formed on a silicon substrate 10. A wiring layer, in which a TiN/Ti film 13, Al wiring 12 and a TiN/Ti film 13 are laminated in order, is formed on the uppermost interlayer insulating film. Next, an interlayer insulating film 14 of a two-layer structure including SiON and $SiO_2$ is formed, and a via-hole 22 which is opened from the surface of the wiring layer is formed.

Thereafter, as shown in FIG. 1B, after an adhered Ti layer (or TiW layer) 15, copper film 17 and TiW film 21 are formed in order on the interlayer insulating film 14, these are patterned to a size suitable for incorporation of a solder ball, and an electrode pad is formed.

Next, as shown in FIG. 1C, after a polyimide film 18 is formed so as to cover the electrode pad, the polyimide film 18 is patterned to provide an opening through which a part of the electrode pad is exposed.

Thereafter, as shown in FIG. 1D, the TiW film 21 on the bottom of the opening is etched off by wet etching process using hydrogen peroxide water ($H_2O_2$).

In this state, an inspection of electrical characteristics of a semiconductor device formed on semiconductor wafer is carried out. At this time, as shown in FIG. 1E, a copper oxide film 23 is formed on the surface of the copper film 17.

Subsequently, as shown in FIG. 1F, a solder ball 20 is formed in the opening 19.

On the other hand, Japanese Unexamined Patent Publication No. 20001-174514 discloses a semiconductor integrated circuit that is constructed to provide unevenness on the surface of an electrode pad (hereinafter called Prior Art 2). In the technology described in the prior art 2, a semiconductor integrated circuit corresponding to an inspecting method for which a probe is disposed perpendicular to the wafer surface is disclosed. By forming unevenness consisting of projections and recesses on the surface of an electrode pad and further elevating the wafer stage after the probe is brought into contact with the projection on the surface of the electrode pad, the metal of the projections on the electrode pad surface can be crushed. Resultantly, a metal oxide film existing on the surface of the projection is broken, whereby the clean metal surface existing therebelow is brought into contact with the probe, and a contact point of low resistance can be obtained. Also, it is described that 0.2 µm or so is adequate as the size of the unevenness (height of the projection relative to the recess) crushed by probing. Further, it is described that, since an increase in the size of the unevenness results in an increase of a partially thin area of an electrode pad, there is a limit to the unevenness, which is ⅕ (one-fifth) or so of the film thickness.

In the process of Prior Art 1, when inspecting the characteristics by bringing a probe needle into contact with a bonding pad, there is a problem in that the contact resistance between the probe needle and the pad is uneven. This depends on slipping of the probe needle when probing, because the surface of the copper film 17 is flat. Since the needle slips, the contact of the pad with the needle is not stabilized, and the contact resistance may change whenever measurement is executed, wherein the value of resistance becomes unstable. Also, since it is difficult to check the needle mark after the measurement, it becomes difficult to check a shift of the probe in terms of its position. This is due to a fact that, since the surface of the copper film 17 is flat, it is difficult for scratches by the probe needle to remain thereon.

Further, in the process of the Prior Art 1, as shown in FIG. 1E, since the surface of the copper film 17 in the opening 19 is covered with an oxide film 23, the wettability of solder is worsened when forming the solder ball 20 as shown in FIG. 2F, wherein there are cases where the solder ball 20 cannot be formed in a satisfactory state. For example, voids are generated in the solder ball 20, and in an extreme case, there are cases where solder is not attached onto the copper film 17. Or, there is a problem in that, since an oxide film 23 intervenes between the solder ball 20 and copper film 17, the resistance increases.

Further, according to Prior Art 2, since the Prior Art 2 is intended to stabilize the resistance according to the principle of crushing the projection of a metal on the surface of the electrode pad by means of a probe although it is possible to make an attempt to stabilize the contact resistance, it is necessary to increase the length of the needle entering into the pad by the pressing force in order to obtain a further stabilized resistance value, that is, it is necessary to apply a further larger load thereto. In this case, there is a concern that the elements may be damaged due to application of a load. Recently, although a so-called low-k film has been widely used as an interlayer insulating film of semiconductor elements, the hardness of the low-k film is low, and it is liable to be cracked. Therefore, such a situation arises, in which there is a further concern that the elements may be likely to be damaged due to application of the load.

On the other hand, there are cases where an electrode pad to be inspected is constructed so that, thereafter, a solder ball is formed on the upper part thereof and a bonding pad is formed. With a peripheral electrode structure including the solder ball, a semiconductor element is electrically connected to a peripheral circuit, and at the same time is mechanically supported on a wiring substrate. When forming the solder ball, the layer located on the surface of the electrode pad is required to have satisfactory wettability in regard to solder. Also, the electrode pad is required to have high heat resistivity with respect to solder as a whole.

Further, recently, lead-free composition has been widely utilized for solder balls. The lead-free solder has a very high content ratio in regard to tin. Conventionally, although copper or a copper alloy of low resistance has been used as a metal that composes the electrode pad, tin is able to easily diffuse these metals and becomes a cause of lowering the reliability of elements. Therefore, it becomes necessary that the composition of the electrode pad corresponds to lead-free solder and has such a structure by which diffusion of the above-described tin can be suppressed.

A laminated structure of a barrier metal layer assuming a role of preventing diffusion of tin contained in the solder ball and a contact layer that is brought into contact with solder is favorable as the above-described pad structure. In the case where such a structure is employed, it is impossible that the contact layer is made thick. Therefore, with such a structure, it is difficult to apply the technology according to the Prior Art 2, in which unevenness of 0.2 μm or so is provided, to the electrode pad.

SUMMARY OF THE INVENTION

It is therefore an object of the present invention to provide a semiconductor device and a method for producing the same, by which stabilized resistance is obtained when carrying out a characteristics inspection by bringing a probe into contact with an electrode pad, and the contacting of the probe can be easily recognized through observation by a microscope and the like.

It is another object of the invention to provide a semiconductor device and a method for producing the same, in which wettability is satisfactory with respect to solder, and solder bumps can be favorably formed on an electrode pad.

A semiconductor device according to the present invention comprises a wiring layer provided on a semiconductor substrate; and an electrode pad for inspection provided on said wiring layer which has a laminated structure of a barrier metal layer and a contact layer laminated in this order, and has unevenness formed on the surface thereof.

An inspection probe is brought into contact with the electrode pad for inspection when inspecting the electrical characteristics of an element to be evaluated, using the invention. Herein, since the surface of the electrode pad for inspection has unevenness and is provided with projections and recesses, the relationship between a probe needle and a pad is stabilized in terms of the positions thereof when the needle is brought into contact with the electrode pad, thereby securing a satisfactory contact condition, wherein unevenness in the contacting resistance is suppressed. Also, since it is easy to check the trace of the probe needle, it becomes easy to confirm a shift of the probe in terms of its position, and efficiency in the characteristics inspection can be improved.

Also, according to the above-described invention, the electrode pad for inspection has a laminated structure of a barrier metal layer and a contact layer. Therefore, even in a case where lead-free solder containing tin, etc. is formed on the pad, diffusion of tin, etc., can be effectively suppressed by the barrier metal layer. As a result, it is possible to prevent the reliability of elements from being lowered due to formation of solder balls.

In the invention, the surface of the electric pad for inspection can be constructed of an anticorrosive treated structure by an anticorrosive agent. A semiconductor device is left, as it is, for a fixed period of time until an inspection is actually carried out after a semiconductor device provided with an electrode pad is formed. At this time, an oxidization film is naturally generated on the surface of the electrode pad, which results in making the contact resistance of the probe needle unstable. By employing an anticorrosive treated structure with an anticorrosive agent on the surface of the electrode pad against a problem resulting from such a leave to stand time, it becomes effective to suppress generation of a natural oxidization film. Benzotriasol and its derivatives may be listed as the anticorrosive agent.

In the invention, the semiconductor device is devised so that a solder bump is provided in contact with the upper part of an electrode pad for inspection. In this case, a solder bump may be formed after an inspection of electrical characteristics is conducted, using an electrode pad for inspection.

A method for producing a semiconductor device according to the invention comprises the steps of: forming a wiring layer on a semiconductor substrate; forming an electrode pad for inspection on the corresponding wiring layer, said electrode pad having unevenness on the surface thereof; and cleaning the surface of the electrode pad for inspection by a cleaning solution containing carboxylic acid or its salt.

The invention is featured in that:

(1) the surface of an electrode pad for inspection is cleaned by a cleaning solution containing carboxylic acid or its salt; and (2) the surface of the electrode pad which is an object to be cleaned has unevenness consisting projections and recesses.

In the invention, since unevenness is formed on the surface of an electrode pad, the positional relationship between a probe needle and a pad is stabilized when the probe needle is brought into the contact with the surface thereof, and a satisfactory contacting condition can be secured. However, there may be cases where influences of a natural oxidization film generated on the surface of the pad become more serious in a case where adequate unevenness, which stabilizes the relationship between the probe needle and the pad in terms of the positions thereof, is provided on the pad surface and makes visual recognition of the trace of the needle satisfactory, than in a case where an oxidization film is formed on a flat pad surface and a pad surface having micro-sized unevenness formed thereon. Accordingly, where adequate unevenness is provided on the pad surface as described above, it becomes a particularly important technical object to exclude influences by the oxidization film.

Therefore, in the invention, after an electrode pad having projections and recesses (unevenness) is formed, the surface of the electrode pad for inspection is cleaned by a cleaning solution containing carboxylic acid or its salt. The carboxylic acid has performance of effectively forming a chelate complex together with a metal oxide film formed on the surface of the electrode pad. On the other hand, since a metal film itself, which composes the pad, is metallic-bonding, it is difficult for the metal film to form a complex together with carboxylic acid, and it can not be etched. Therefore, the electrode pad does not deteriorate, and a natural oxidization film can be selectively removed. Also, since, as described above, carboxylic acid has a chelate action, it is possible to suppress the metal oxidized substance, which is once removed, from being adhered again.

As described above, according to the invention, since the surface of the electrode pad having projections and recesses on the surface thereof is cleaned by a cleaning solution containing carboxylic acid or its salt, the oxide film on the surface of the electrode pad is removed, wherein the resistance value in conducting characteristics inspection is stabilized. In addition, it is possible to reduce the contact resistance when a solder ball is formed on the pad. Further, since the contact resistance is stabilized by removing the metal oxide film, it becomes possible to conduct a characteristics inspection without any increase in the amount of press-forcing the needle into the pad as in the prior arts, wherein when inspecting the characteristics, it is possible to prevent the metal film from being damaged.

In the invention, it is possible to form an electrode pad having projections and recesses on the surface thereof by or through the following processes. That is, the electrode pad can be formed by wet treating the surface of a metal film using a chemical solution containing acid after the metal film is formed. Thus, it is possible to control the degree of unevenness by adjusting the concentration of the acid, the relationship between the probe needle and pad can be stabilized in terms of the positions thereof, and it is possible to produce adequate unevenness, by which visible recognition of the needle trace can be satisfactorily improved, at a satisfactory production stability.

The step of forming an electrode pad having projections and recesses (unevenness) on the surface thereof may include a step of forming a contact layer on a barrier metal layer after the barrier metal layer is formed on a wiring layer, and wet-treating the surface of the contact layer using a chemical solution containing acid. According to such a construction, since the electrode pad is constructed by a laminated structure of a barrier layer and a contact layer, a semiconductor device can be constructed so as to correspond to a lead-free solder containing a large amount of tin, etc.

In the invention, a step of treating the surface of the above-described electrode pad for inspection with an anticorrosive agent may be further included after the step of cleaning the surface of the above-described electrode pad for inspection with a cleaning solution including the carboxylic acid or its salt. Thereby, in a fixed period of time with the surface of the electrode pad exposed, oxidization of the surface does not proceed, and stability of the resistance value in conducting a characteristics inspection can be satisfactorily maintained. In addition, no oxidization film intervenes between the solder and a pad when a solder ball is formed on the pad, wherein it is possible to reduce the contact resistance. Further, the solder wettability thereof can be improved, and it is possible to favorably form a solder ball to a desired profile. In particular, since the solder wettability is remarkably lowered in a case where an oxidization layer remains where lead-free solder is used, if the above-described step is applied to such solder, the step becomes further effective.

A step of forming a solder bump in contact with the upper part of the electrode pad for inspection may be further included after the step of cleaning the surface of an electrode pad for inspection by a cleaning solution containing carboxylic acid or its salt. After an anticorrosive treatment is carried out after the above-described cleaning step, a solder bump may be formed.

In the invention, a cleaning solution, which cleans the surface of an electrode pad having a convex and concave surface after the electrode pad is formed, contains carboxylic acid or its salt. A carboxyl group which is contained in carboxylic acid is adsorbed to a metal oxide film formed on the electrode pad, and a chelate action is brought about, whereby the metal oxidized film can be effectively removed.

It is preferable that the carboxylic acid has two or more carboxylic groups in its molecule. Thereby, the chelate action which is brought about by the carboxylic acid becomes further remarkable, and the cleaning performance can be improved. In detail, it is preferable that the carboxylic acid contains at least one type selected from a group consisting of oxalic acid, citric acid, malic acid, maleic acid, succinic acid, tartaric acid, and malonic acid.

Of these, oxalic acid has performance of effectively forming a chelate complex together with copper oxide (CuOx). On the other hand, since the copper film is metal-coupled, a complex is scarcely formed, and no etching is carried out. Therefore, in cases where a metal containing copper is disposed on the surface of an electrode pad, it is particularly favorable that oxalic acid is used as carboxylic acid.

BRIEF DESCRIPTION OF THE DRAWINGS

FIGS. 2A through 2D are sectional views showing a method for producing a semiconductor device according to a first embodiment of the invention in order of steps;

DETAILED DESCRIPTION OF THE PREFERRED EMBODIMENTS

Hereinafter, a description is given of preferred embodiments of the invention with reference to the accompanying drawings. In the first embodiment, first, a series of steps, which are the same as those in FIG. 1A through FIG. 1D, are carried out. Next, respective steps shown in FIG. 2A through 2D are carried out.

Figure 1A:
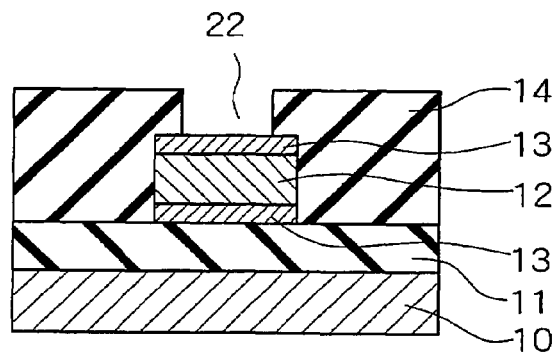
FIG. 1A through FIG. 1F are sectional views showing a prior art method for producing a semiconductor device in order of steps.
Figure 1B:
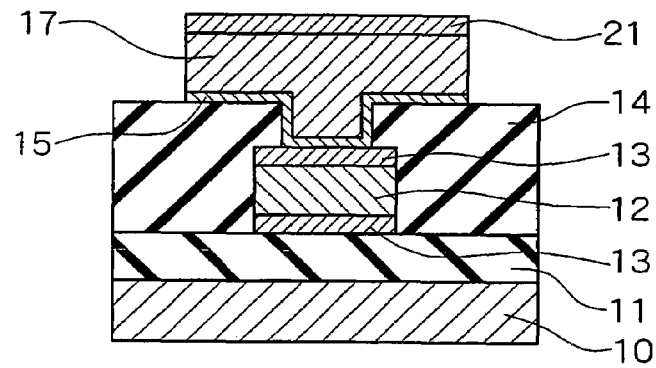
Figure 1C:
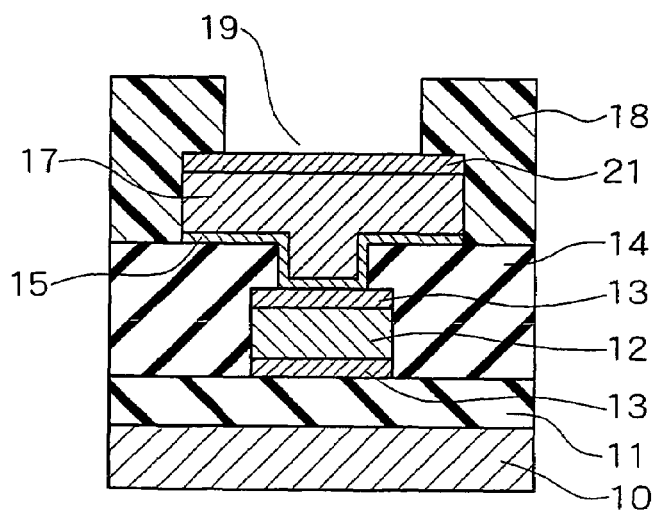
Figure 1D:
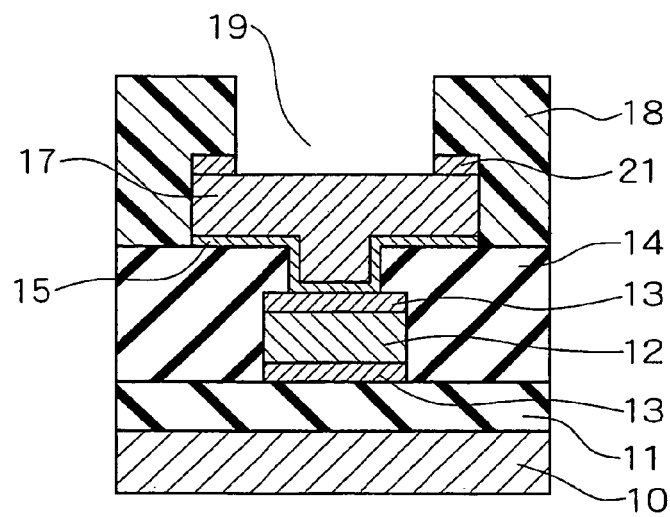
Figure 1E:
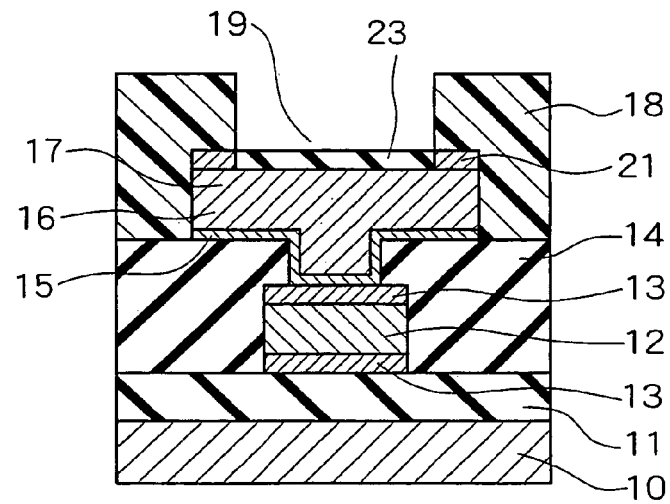
Figure 1F:
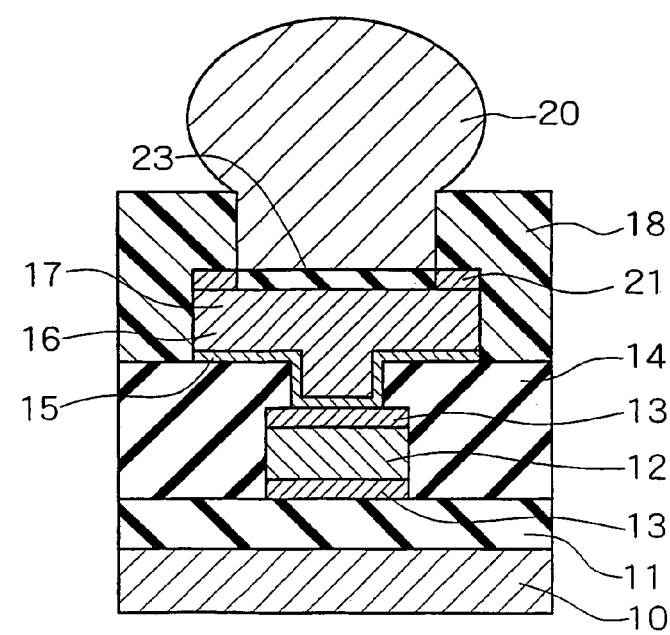

First, as shown in FIG. 1D, wet treatment is carried out using a surface treatment solution as shown in FIG. 2A after the surface of a copper film 17 is exposed in an opening 19, and unevenness 9 is formed on the surface of the copper film 17. FIG. 2A shows a state after the surface treatment is carried out using a surface treatment solution. A solution or liquid capable of adequately dissolving the surface of the copper film 17 is used as the surface treatment solution. It is preferable that the solution is such that it can adequately roughen the surface of copper and form adequate unevenness. Herein, adequate unevenness means that the relationship between a probe needle and a pad is stabilized in terms of the position thereof when carrying out a characteristics inspection, stability is brought about in terms of measurement, visible recognition of the needle trace can be improved, and solder and the pad are satisfactorily adhered to each other when forming solder balls. With respect to such unevenness, if it is expressed in terms of surface roughness Ra (mean roughness on the centerline), the lower limit thereof is preferably 0.01 μm or more, and further preferably 0.03 μm or more. Also, the upper limit thereof is preferably 0.15 μm or less, and further preferably 0.1 μm or less. If the unevenness is too small, resistance for inspection becomes unstable, and at the same time, no improvement effect can be recognized in regard to cohesion between the solder and pad. On the other hand, if the unevenness is too large, there are cases where sufficient stability in resistance cannot be obtained. In addition, in a case where a laminated structure of a barrier metal layer and a contact layer is employed with respect to lead-free solder, an extremely thin portion is produced on the contact layer, wherein such a structural inconvenience may occur in the layer construction of an electrode pad. In order to form adequate unevenness as described above, it is appropriate that a treatment solution, in which an etching rate with respect to the copper film 17 is 300 nm/min. or less, is used. For example, a blended solution of dilute sulfuric acid and hydrogen peroxide is favorably employed. The blended solution is largely different in concentration from a sulfuric acid-hydrogen peroxide blended solution so-called "SPM". Although the ratio of (sulfuric acid):(hydrogen peroxide):(water of the so-called SPM) is 4:1:0 (in terms of cubic volume) or so, it is preferable that the blended solution of dilute sulfuric acid and hydrogen peroxide which is employed in the embodiment has a ratio of (sulfuric acid):(hydrogen peroxide):(water), to be 1:X:Y (in terms of cubic volume) where X=0.5 through 20, and Y=10 through 10000.

By using such a treatment solution, adequate unevenness is formed without excessively eroding the copper film 17.

After the treatment is completed, as shown in FIG. 2B, an oxide film 24 is formed on the copper film 17.

Next, in order to remove the oxide film 24, cleaning is carried out using a cleaning solution. Characteristics required for the cleaning solution are, first, to be able to effectively remove the oxide film 24 which has been dissolved and removed from re-attaching, second, not to damage the surface of the copper film 17, and third, to prevent the oxide film 24. Carboxylic acid may be listed as the cleaning solution that meets such requirements. It is favorable that detailed examples of carboxylic acid may contain at least one type selected in a group consisting of oxalic acid, citric acid, malic acid, maleic acid, succinic acid, tartaric acid, and malonic acid.

Figure 2C:
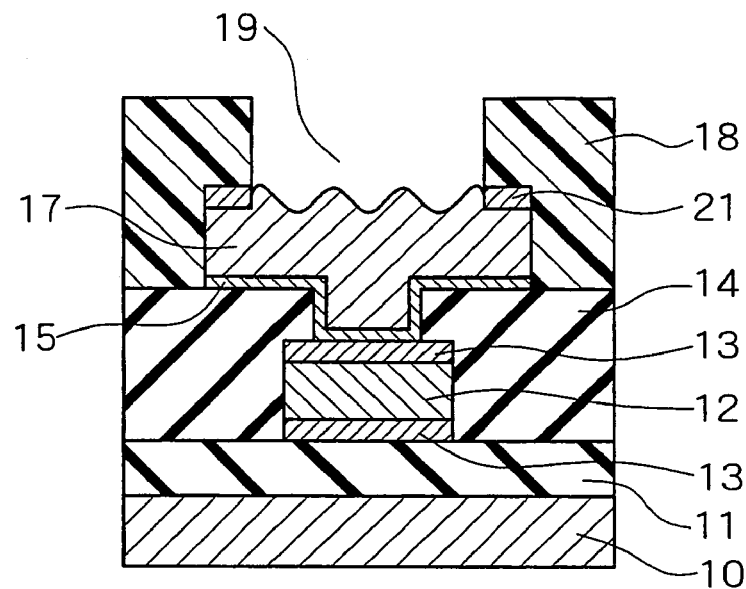

The oxide film 24 shown in FIG. 2B is removed by carrying out treatment using the cleaning solution as described above, and as shown in FIG. 2C, the copper film 17 is exposed. Continuing anticorrosive treatment is applied onto the surface of the copper film 17. Thereby, the copper film 17 is prevented from being oxidized, and it is possible to prevent the contact resistance with solder balls from increasing. The anticorrosive treatment can be carried out by using a treatment solution such as benzotriazol, etc.

An anticorrosive agent solution may be used as the treatment solution for anticorrosive treatment. Triazol-based chemical compound and its derivative-based chemical compound may be used as the anticorrosive agent. In detail, benzotrial, 1,2,3-triazol, 1,2,4-triazol, carboxybenzotriazol, 1-hydroxybenzotriazol, nitrobenzotriazol, 5-methyl-1H-benzotriazol, and dihydroxypropylbenzotriazol may be independently used, or two or more of the above compounds may be concurrently used. By using these chemical compounds, a sufficient anticorrosive effect can be obtained with a slight amount thereof.

Also, heterocyclic compounds other than benzotriazol-based compounds may be used. As detailed examples of the heterocyclic compounds, the following compounds may be listed, that is, purine such as purine, 6-aminopurine, 2-amino-6-oxopurine, 6-furfurylaminopurine, 2,6-(1H.3H)-purinedione, 2-amino-6-hydroxy-8-mercaptopurine, allopurinol, uric acid, kinetin, zeatin, guanine, xanthine, hypoxanthine, adenine, theophylline, caffeine, theobromine, etc., and their derivatives; azaguanine such as 8-azaguanine, etc., and its derivatives; pteridine and pterin such as pteridine, pterin, 2-amino-4,6-dihydroxypteridine, 2-amino-4,7-dihydroxypteridine, 2-amino-4,6,7-trihydroxypteridine, etc., and their derivatives; cyanuric acid and isocyanuric acid such as cyanuricacid, isocyanuric acid, triscarboxymethylisocyanuric acid, triscarboxyethylcyanuric acid, triscarboxymethylisocyanuric acid, triscarboxyethyl-isocyanuric acid, etc., and their derivatives; hydantoin and allantoin such as hydantoin, dimethylhydatoin, allantoin (5-ureidehydatoin), etc., and their derivatives; barbituric acid and its derivatives, nicotinic acid such as isonicotimic acid, citrazinic acid, etc., and its derivatives. These may be independently used or two or more of these compounds may be concurrently used. Of the above-described compounds, purine and its derivatives, cyanuric acid, isocyanuric acid and their derivatives, and nicotinic acid and its derivatives may be preferably used. Such heterocyclic compounds are excellent in biodegradability, and can display excellent effects against corrosion with respect to metals such as copper, etc.

An anticorrosive agent according to the invention may be used by being dispersed in water or a water-soluble organic solvent described later. In this case, alkanolamine, etc., may be added thereto. If so, solubility of the anticorrosive agent can be improved. Herein, if alkanolamine having excellent biodegradability is selected, it can be made into an anticorrosive solution having particularly excellent stability and biodegradability.

Monoethanolamine, diethanolamine, N-ethylaminoethanol, N-methylaminoethanol, N-methyldiethanolamine, dimethylaminoethanol, 2-(2-aminoethoxy)ethanol, 1-amino-2-propanol, triethanolamine, monopropanolamine, dibuthanolamine, etc., may be listed as detailed examples of alkanolamine, etc. Of these compounds, monoethanolamine, and N-methylaminoethanol are particularly preferable. These compounds may be independently used, or a combination of two or more of the compounds may be used.

There is no special limitation in regard to the content ratio of the anticorrosive constituent such as benzotriazol, etc., in the anticorrosive treatment solution. However, for example, the content ratio may be 0.001% through 10% by mass. If such a mixture ratio is employed, further higher anticorrosive performance can be displayed.

In the present embodiment, an electrical characteristic inspection is carried out in this state. In a state as shown in FIG. 2C, the surface of the copper film 17 has unevenness (projections and recesses) and is made clean with the oxide film removed. Therefore, where a probe needle is brought into contact with a bonding pad, the relationship between the needle and pad is stabilized in terms of their positions to bring about a satisfactory contact state, wherein unevenness of the contact resistance can be suppressed. Also, since it is easy to confirm the trace of the probe needle, it becomes easy to recognize a shift of the probe in terms of its position, wherein efficiency of the characteristics inspection can be improved. Further, in forming a solder ball in the next step, the solder wettability becomes satisfactory, and the solder adhesion can be also improved.

Figure 2D:
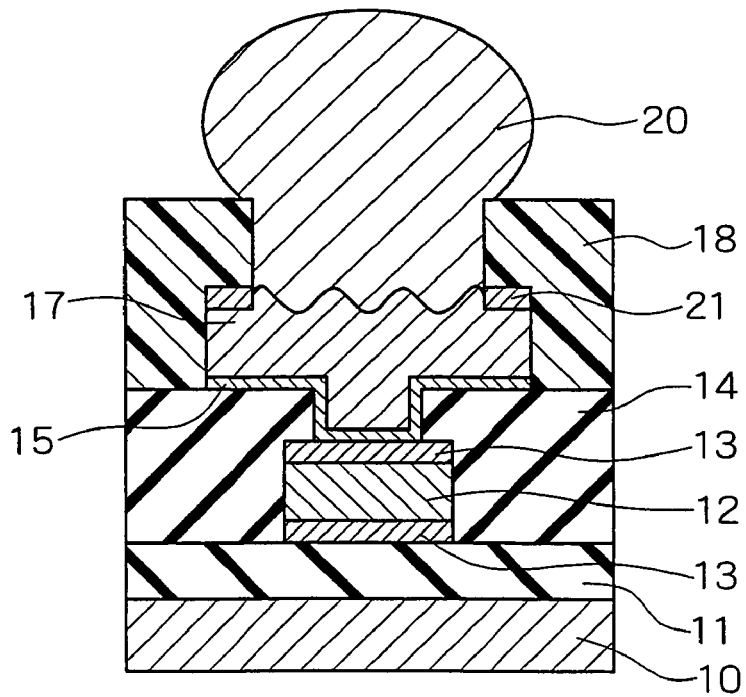

After the anticorrosive treatment, as shown in FIG. 2D, a solder ball 20 is formed by adhering solder to the opening 19. In the embodiment, since unevenness is provided on the surface of the copper film 17, wettability of solder is improved, wherein the solder ball 20 can be satisfactorily formed. Also, since no oxide film intervenes between the solder ball 20 and copper film 17, the contact resistance can be lowered.

Next, a description is given of the second embodiment of the invention with reference to FIG. 3A through FIG. 3D. The first embodiment is an example in which an electrode pad is composed of a copper film 17. In the second embodiment, an electrode pad is composed of a laminated structure of a barrier metal layer formed of a metal containing nickel and a contact layer formed of copper, wherein a pad structure capable of matching lead-free solder can be brought about.

Figure 3A:
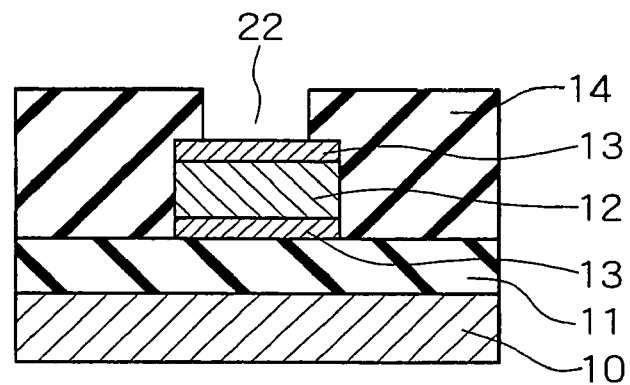
FIGS. 3A through 3D are sectional views showing a method for producing a semiconductor device according to a second embodiment of the invention in order of steps.

First, as shown in FIG. 3A, a multilayer film 11 in which a wiring layer and an interlayer insulating film are laminated is formed. The wiring layer in which a TiN/Ti film 13, Al wiring 12, and TiN/Ti film 13 are laminated in order on the interlayer insulating film of the uppermost layer is formed. Next, a two-layered interlayer insulating film 14 including SiON and $SiO_2$ is formed, and a via-hole 22 opening from the surface of the wiring layer is formed.

Figure 3B:
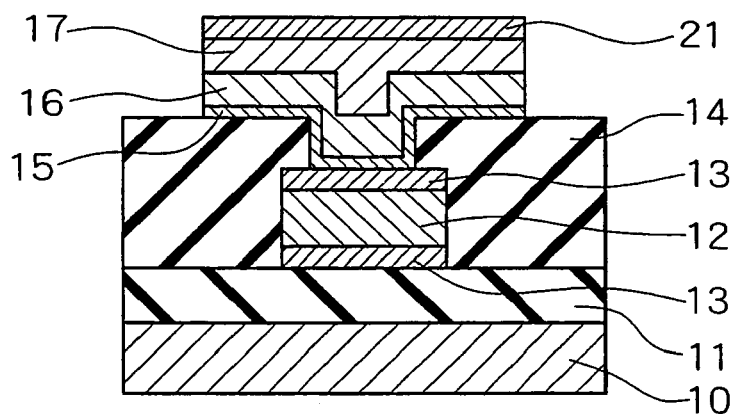

Thereafter, as shown in FIG. 3B, after an adhered Ti layer (or TiW layer) 15, nickel-vanadium alloy film 16, copper film 17 and TiW film 21 are formed on the interlayer insulating film 14 one after another, these are patterned to a size suitable for incorporation of a solder ball, and an electrode pad is formed.

Figure 3C:
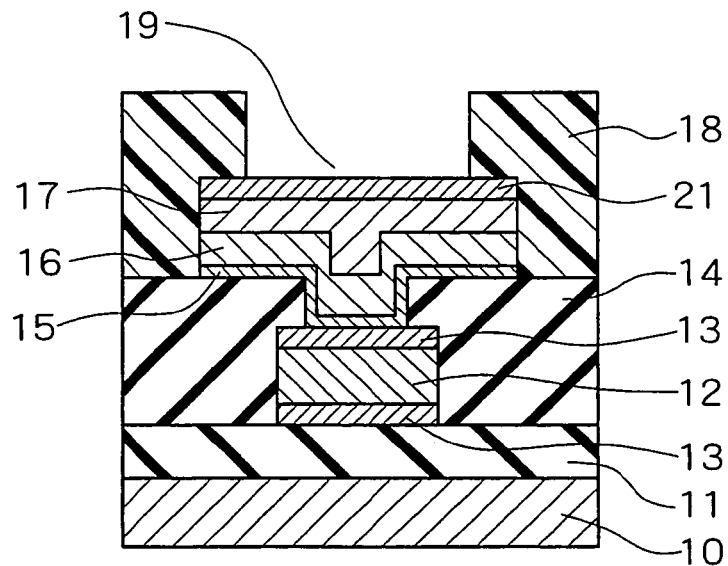

Next, as shown in FIG. 3C, after a polyimide film 18 is formed so that it can cover the electrode pad, an opening is prepared by patterning the polyimide film 18 to expose a part of the electrode pad.

Thereafter, after the TiW film 21 on the bottom of the opening is removed by wet etching using hydrogen peroxide water, wet treatment to apply unevenness onto the surface of the copper film 17, and carboxylic acid cleaning to remove an oxide film are carried out. A chemical solution used for the treatments are as described with respect to the first embodiment.

Figure 3D:
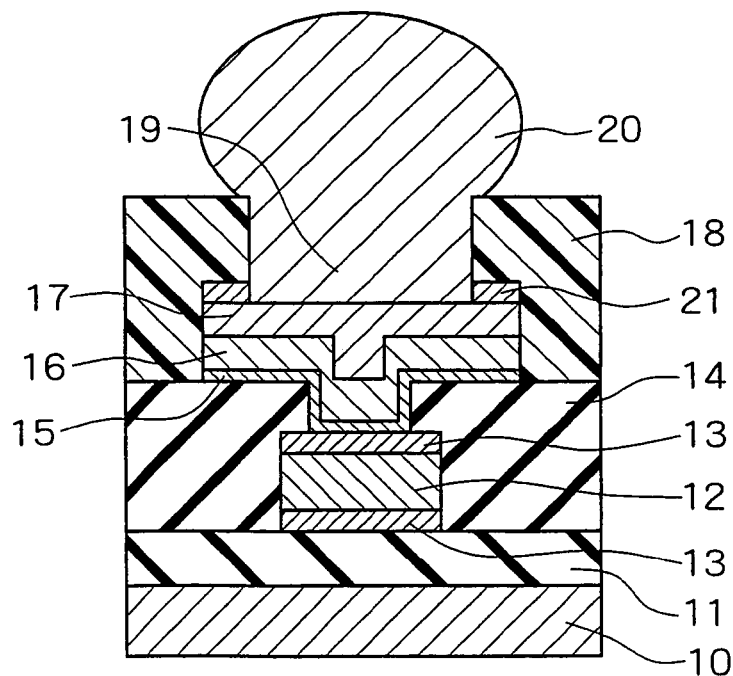

Subsequently, as shown in FIG. 3D, after anticorrosive treatment is adequately carried out on the surface of the copper film 17 using an anticorrosive agent, a solder ball 20 is formed in the opening 19.

In order to secure an electrode pad capable of matching lead-free solder, it is favorable that the electrode pad is composed of a material by which tin, etc., existing in the solder can be prevented from diffusing. Nickel and nickel alloy may be listed as such a material. However, these materials are liable to be oxidized, and solder wettability thereof is not satisfactory. In this regard, in the present embodiment, an electrode pad of a two-layered structure consisting of a barrier metal layer formed of nickel or nickel alloy and a contact layer formed thereon is formed.

In the present second embodiment, the nickel-vanadium alloy film 16 corresponds to the barrier metal layer and can achieve a role of preventing diffusion of tin, etc., which are contained in a solder ball. A nickel or nickel alloy may be favorably used as the barrier metal layer, because nickel or nickel alloy is excellent in barrier performance in regard to the diffusion of the tin contained in lead-free solder. By using a nickel alloy containing a slight amount of vanadium rather than using a nickel (pure metal), film formation using, for example, a spattering method, can be facilitated. Also, in the embodiment, although a nickel-vanadium alloy is used, tungsten, tantalum, silicon, copper, etc., may be selected as an additive other than the above.

In the second embodiment, the copper film 17 corresponds to the contact layer directly brought into contact with the solder ball 20. The contact layer is excellent in solder wettability, and a material of low resistance is favorably used. Although copper is used in the embodiment, for example, a copper-aluminum alloy, etc., may be used in addition thereto. It is sufficient that the contact layer is in a form for which it can cover the barrier metal layer. And, it is favorable that the thickness thereof is 0.5 μm or less. If it is remarkably thick, a performance of preventing tin from diffusing may be lowered. Also, where the contact layer is composed of copper or copper alloy, a plating method and a spattering method may be used as the formation method. However, the plating method is further favorable in view of forming adequate unevenness with satisfactory maneuverability.

Next, a semiconductor device according to the embodiments of the invention is produced, and a description is given of results of having tested the characteristics thereof.

EXAMPLE 1

In the example, results of inspection of electrical characteristics using a bonding pad are compared with each other on the basis of the presence of a treatment solution. In the example, a preliminary structure in which an electrode pad composed of a wiring layer and a copper film are provided on a wafer was produced. Evaluation was carried out after the following treatments were carried out on the electrode pad.

Test Sample a: Untreated.

Test Sample b: Treated with a blended solution of dilute sulfuric acid and hydrogen peroxide in order to produce unevenness.

Test Sample c: Treated with a blended solution of dilute sulfuric acid and hydrogen peroxide in order to produce unevenness and also treated with an oxalic acid water solution.

The ratio of dilute sulfuric acid and hydrogen peroxide in the blended solution was sulfuric acid hydrogen peroxide: water=1:1:1000 (in terms of cubic volume). And, the oxalic acid water solution was 0.03% by mass.

Figure 4:
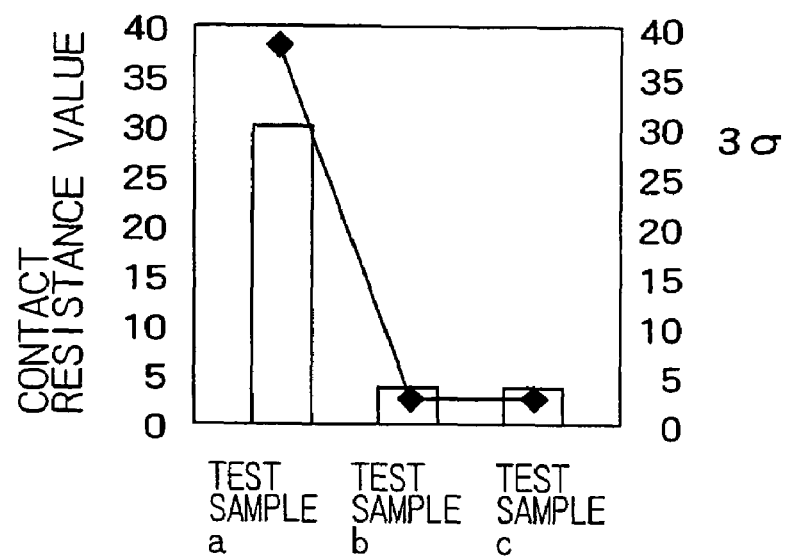
FIG. 4 is a view showing contact resistance values of a semiconductor device according to the embodiments of the invention.

With respect to the respective samples treated as described above, the characteristics inspection was conducted for a number of measurements totaling 128. The characteristics inspection was conducted by bringing the probe needle into contact with the electrode pad. The results of evaluation are shown in FIG. 4. In the drawing, bar graphs indicate mean values (relative values) of the contact resistance, and line graphs indicate 3σ values (relative values) of the measurement values. By forming unevenness on the electrode pad and forming the surface of the electrode pad by a blended solution, etc., of dilute sulfuric acid and hydrogen peroxide, it was confirmed that the contact resistance values were remarkably stabilized. Also, in Test Sample c, it was confirmed that the 3σ values were remarkably improved in comparison with Test Sample b.

EXAMPLE 2

A preliminary structure in which an electrode pad composed of a wiring layer and a copper film are provided on a wafer was produced as in Example 1. After the following treatments were carried out on the electrode pad, solder wettability was evaluated.

Test Sample 1: Untreated.

Test Sample 2: Treated with an oxalic acid water solution after being treated with a blended solution of dilute sulfuric acid and hydrogen peroxide in order to produce unevenness.

Test Sample 3: Treated with an oxalic acid water solution after being treated with a blended solution of dilute sulfuric acid and hydrogen peroxide in order to produce unevenness, and next, anticorrosive treatment was conducted on the surface of the electrode pad by an anticorrosive agent.

The ratio of dilute sulfuric acid and hydrogen peroxide in the blended solution was sulfuric acid: hydrogen peroxide: water=1:1:1000 (in terms of cubic volume). And, the oxalic acid water solution was 0.03% by mass. A benzotriasol water solution (0.05% by mass) was used as the anticorrosive agent.

Figure 5:
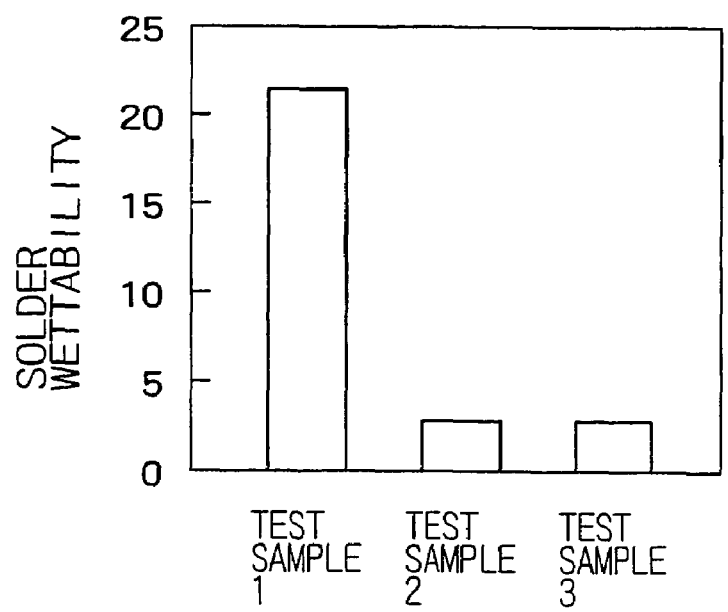
FIG. 5 is a view showing solder wettability of a semiconductor device according to the embodiments of the invention.

Results of evaluation were shown in FIG. 5. The ordinate in FIG. 5 indicates the number of samples, in which defective solder wettability occurred, in terms of relative values. The smaller the number becomes, the better the solder wettability becomes. Based on the results shown, in Test Samples 2 and 3, it can be understood that solder wettability has been remarkably improved in comparison with the untreated Test Sample 1.

EXAMPLE 3

In the example, processes that are similar to those in FIG. 1A through FIG. 1F and FIG. 2A through FIG. 2D were conducted. At that time, test samples were produced by varying the methods for treatment of the electrode pad surface, and visual recognition of the traces of the probe needle and stability of the contact resistance were evaluated when carrying out the characteristics inspection. The surface treatments of the electrode pad in the respective test samples were as follows:

Test Sample a: Hydrogen peroxide water treatment was conducted.

Test Sample b: After hydrogen peroxide water treatment was conducted, a treatment using a blended solution of dilute sulfuric acid and hydrogen peroxide was carried out in order to produce unevenness.

Test Sample c: After hydrogen peroxide water etching was conducted, a treatment using a blended solution of dilute sulfuric acid and hydrogen peroxide was carried out in order to produce unevenness. Next, still further treatment (cleaning) was executed using an oxalic acid water solution.

Test Sample d: After hydrogen peroxide water treatment was carried out, the test sample was treated with an oxalic acid water solution.

Also, the treatment by hydrogen peroxide water of the respective test samples corresponds to the etching to remove the TiW film in FIG. 1D.

The results are shown in Tables 1 and 2 below.

As shown in table 1, in the test samples which are treated by the blended solution of dilute sulfuric acid and hydrogen peroxide, visual recognition of traces of the probe needle could be improved. By treatment of the solution, it is considered that adequate unevenness is provided on the surface of the electrode pad. Also, it was confirmed that stability in the contact resistance was improved by carrying out an oxalic acid cleaning after treatment by the solution.

Table 2 indicates the mean values of the contact resistance of the respective test samples and 3σ values thereof. It was confirmed that stability in the contact resistance was improved by the oxalic acid treatment. It is considered that, by treatment, the oxide film on the surface of the electrode pad was removed.

TABLE 1

| Test Sample | Treatment | Visual recognition of needle traces | Contact resistance |
| --- | --- | --- | --- |
| A | $H_2O_2$ | X | X |
| B | $H_2O_2 \rightarrow$ Dilute sulfuric acid | ○ | Δ |
| C | $H_2O_2 \rightarrow$ Dilute sulfuric acid $\rightarrow$ Oxalic acid | ○ | ○ |
| D | $H_2O_2 \rightarrow$ Oxalic acid | X | ○ |

However, as regards the visual recognition of needle traces, ○ indicates "satisfactory", and x indicates "not good", and as regards the contact resistance, ○ indicates "stable", Δ indicates "slightly unstable", and x indicates "unstable".

TABLE 2

| Test Sample | Treatment | Average | Contact resistance |
| --- | --- | --- | --- |
| A | $H_2O_2$ | 15.1 | 13.2 |
| B | $H_2O_2 \rightarrow$ Dilute sulfuric acid | 1.3 | 1.5 |
| C | $H_2O_2 \rightarrow$ Dilute sulfuric acid $\rightarrow$ Oxalic acid | 1.0 | 1.0 |
| D | $H_2O_2 \rightarrow$ Oxalic acid | 1.0 | 1.0 |

However, the mean values of the contact resistance and 3σ values thereof are standardized, assuming that the value of Test Sample c is 1.0.

What is claimed is:

1. A method for producing a semiconductor device, comprising the steps of:
   forming a wiring layer on a semiconductor substrate;
   forming an electrode pad for inspection on said wiring layer, said electrode pad having unevenness on the surface thereof;
   removing an oxide film formed on the surface of said electrode pad for inspection, having unevenness on the surface thereof, by a cleaning solution containing carboxylic acid or its salt;
   conducting a characteristic inspection by bringing a probe needle into contact with the surface after removing the oxide film; and
   soldering on the surface after conducting the characteristic inspection.

2. The method for producing a semiconductor device as set forth in claim 1, wherein the forming of an electrode pad for inspection includes the steps of:
   forming a metal film on said wiring layer; and
   wet-treating the surface of said metal film using a chemical solution containing acid.

3. The method for producing a semiconductor device as set forth in claim 1, wherein the surface roughness Ra of said electrode pad for inspection is 0.01 μm or more and 0.15 μm or less.

4. The method for producing a semiconductor device as set forth in claim 1, further comprising a step of treating the surface of said electrode pad for inspection, which has unevenness on the surface thereof and from which the oxide film is removed, with an anticorrosive agent and thereafter conducting a characteristic inspection by bringing a probe needle into contact with the surface of the electrode pad for inspection.

5. The method for producing a semiconductor device as set forth in claim 1, wherein said carboxylic acid is polyvalence carboxylic acid.

6. The method for producing a semiconductor device as set forth in claim 5, wherein said polyvalence carboxylic acid includes at least one selected from a group consisting of oxalic acid, citric acid, malic acid, maleic acid, succinic acid, tartaric acid, and malonic acid.

7. The method for producing a semiconductor device as set forth in claim 1, wherein the forming of an electrode pad for inspection includes the steps of:

forming a barrier metal layer on said wiring layer;
forming a contact layer on said barrier metal layer; and
wet-treating the surface of said contact layer using a chemical solution containing acid.

8. The method for producing a semiconductor device as set forth in claim 7, wherein said barrier metal layer is formed of nickel or nickel alloy.

9. The method for producing a semiconductor device as set forth in claim 7, wherein said contact layer is formed of copper or copper alloy.

* * * * *